United States Patent [19]
Coy

[11] Patent Number: 5,914,621
[45] Date of Patent: Jun. 22, 1999

[54] CHARGE BALANCED RAMP WITH IMPROVED SIGNAL LINEARITY

[75] Inventor: Bruce Harrison Coy, San Diego, Calif.

[73] Assignee: Applied Micro Circuits Corporation, San Diego, Calif.

[21] Appl. No.: 09/019,521

[22] Filed: Feb. 5, 1998

[51] Int. Cl.[6] .................................................. H03K 4/06
[52] U.S. Cl. .......................................... 327/134; 327/131
[58] Field of Search ................................... 327/131–138, 327/140, 170, 91, 94

[56] References Cited

U.S. PATENT DOCUMENTS

| | | | |
|---|---|---|---|
| 3,411,153 | 11/1968 | Steele | 340/347 |
| 4,356,410 | 10/1982 | Miskin | 327/131 |
| 4,409,494 | 10/1983 | Smith | 307/238.3 |
| 4,503,396 | 3/1985 | Fawkes | 328/127 |
| 4,626,702 | 12/1986 | Chito | 327/132 |
| 4,739,192 | 4/1988 | Price, Jr. | 307/362 |
| 4,774,497 | 9/1988 | Taylor | 341/118 |
| 4,779,013 | 10/1988 | Tanaka | 307/443 |
| 4,885,585 | 12/1989 | Barrow et al. | 341/169 |
| 4,950,929 | 8/1990 | Yan | 307/491 |
| 5,241,221 | 8/1993 | Fletcher et al. | 307/263 |
| 5,262,688 | 11/1993 | Tateishi | 327/170 |
| 5,329,175 | 7/1994 | Peterson | 307/443 |
| 5,406,215 | 4/1995 | Asahina | 326/27 |
| 5,483,183 | 1/1996 | Li et al. | 327/54 |
| 5,502,410 | 3/1996 | Dunn et al. | 327/140 |
| 5,514,979 | 5/1996 | Collins et al. | 326/27 |
| 5,517,143 | 5/1996 | Gross | 327/108 |
| 5,585,795 | 12/1996 | Yuasa et al. | 341/118 |
| 5,617,051 | 4/1997 | Bingham | 327/317 |
| 5,627,486 | 5/1997 | Gross | 327/108 |
| 5,633,637 | 5/1997 | Noro | 341/144 |

*Primary Examiner*—Toan Tran
*Attorney, Agent, or Firm*—Gray Cary Ware Freidenrich

[57] ABSTRACT

A ramp circuit repeatedly generates a substantially linear ramp signal. Ramp switch junction capacitance that otherwise causes a nonlinear output is compensated to improve signal linearity and enable faster retriggering. The ramp includes an output transistor, with its output coupled to a current source and a charge storage device. The output charge storage device charges when the transistor is on. When the transistor is turned off, the output charge storage device discharges, resulting in the changing ramp signal. The output transistor inherently includes a junction capacitance, which causes a nonlinearity in the discharge of the charge storage device. This nonlinearity appears as a quick drop in the ramp signal relative to the slower rate of steady-state decrease. This nonlinearity is prevented, however, by compensating for the output transistor's junction capacitance. In one embodiment, compensation circuitry includes a compensation capacitor coupled between the ramp output and a pull-up register attached to a power supply voltage. An input stage includes two transistors, each having a power supply node, an input node, and an output node. The transistors are interconnected at their output nodes, coupled to electrical ground via a current source power supply. The power supply node of the first transistor is coupled to the node connecting the pull-up resistor and the compensation capacitor. The power supply node of the second transistor is coupled to a second pull-up register attached to the power supply. The first transistor receives a reset signal input to the ramp, whereas the second transistor receives a trigger signal that is the inverse of the reset signal.

28 Claims, 6 Drawing Sheets

CHARGE BALANCED RAMP WITH IMPROVED SIGNAL LINEARITY

BACKGROUND OF THE INVENTION

1. Field of the Invention

The present invention relates to electronic timers for generating precise timing signals. More particularly, the invention concerns a ramp circuit that uses charge balancing to achieve improved ramp signal linearity, enabling faster retriggering.

2. Description of the Related Art

Electronic timers are widely used in many different applications. For example, electronic clocks generate carefully defined, high speed clock cycles necessary to operate digital computers. Timers are also an integral component of test circuits that measure and evaluate operational characteristics of circuits such as memory, microprocessors, high speed logic circuits, and the like. This type of test circuit is often implemented in an automatic test equipment board, which frequently includes both digital and analog circuits.

In this context, engineers have developed a class or circuits called "timing verniers", which provide finely adjustable timing signals. Timing verniers are often sold as a "macro" item, selected by a customer for use in an application specific integrated circuit along with other desired components.

There are many known timing verniers, one class of which is exemplified by the model PDS01S product manufactured by Applied Micro Circuits Corp. (AMCC). This class of timing vernier includes a number of components, shown in simplified block form in FIG. 1. Namely, the timing vernier 100 includes a ramp 102, digital-to-analog converter (DAC) 104, comparator 106, and threshold sensor 114. The ramp 102 produces an analog voltage signal (at output 103) that decreases at a prescribed linear rate. The signal at the output 103 may also be called a "ramp" signal. The DAC 104 provides a fixed analog timing signal select (at output 110) according to a digital timing select input signal (at input 108). When the comparator 106 determines that the ramp's decreasing output signal (at 103) reaches the fixed analog timing select signal 110, the comparator 106 produces a timing event. The timing event is a characteristic of the timing output signal, and may comprise a pulse, digital signal transition (i.e., high-to-low or low-to-high), or another recognizable signal characteristic. When the threshold sensor 114 determines that the ramp's decreasing output signal (at 103) matches the fixe reset select signal on the line 115, the sensor 114 issues a reset signal to the ramp 102, causing the ramp 102 to bring its output back to a predetermined starting level.

Figure 2:
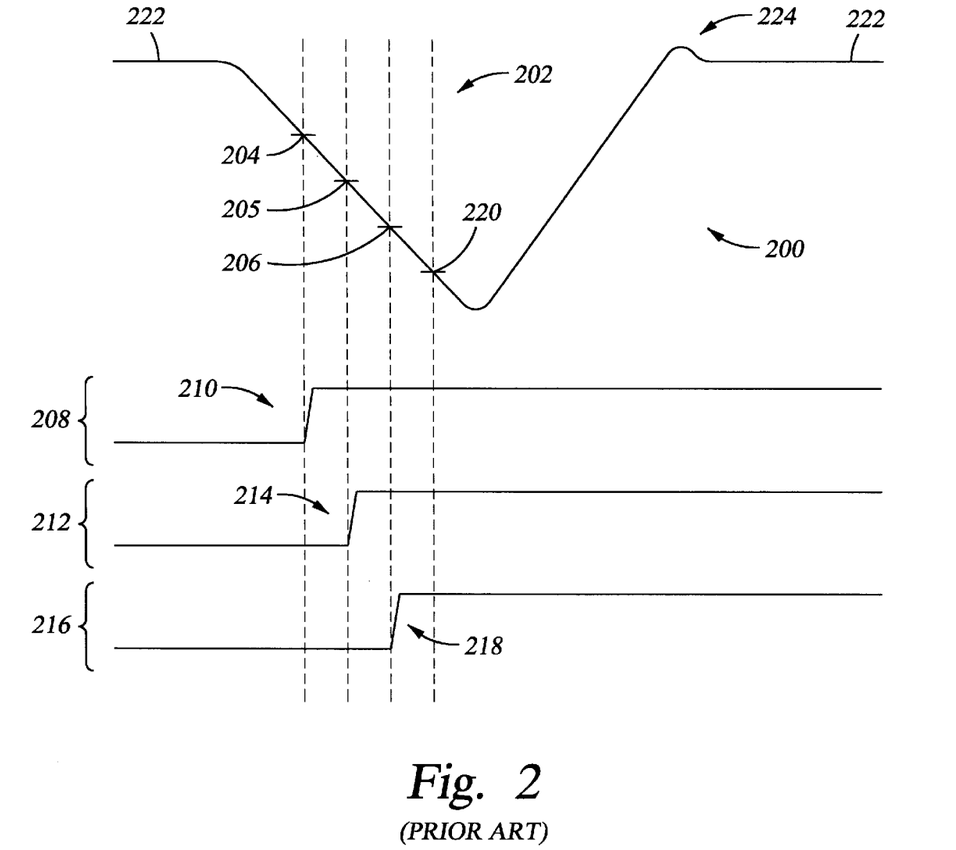
FIG. 2 is a timing diagram illustrating the operation of a known timing vernier.

FIG. 2 depicts a timing diagram illustrating the operation of the timing vernier 100. The output 103 of the ramp 102 is shown by the waveform 200. Starting from a predetermined starting value 222, the waveform 200 then provides an analog voltage decreasing at a constant level throughout a region 202 of the waveform 200. Several alternative analog timing select signals 110 are shown by the levels 204–206. Each different analog timing select signal is produced by changing the voltage of the digital timing select input signal 108. Different analog timing select signals produce timing events that occur at different times.

For example, if the digital timing select signal 108 is chosen to provide an analog timing select signal 204, the comparator 106 detects when the ramp signal 200 reaches the level 204 when this occurs, the output 112 of the comparator 106 exhibits a timing signal 208 including the timing transition 210. As a different example, the digital timing select signal 108 may be set to yield an analog timing select signal at the level 205. In this case, when the comparator 106 detects the ramp signal 202 reaching the level 205, the output 112 of the comparator 106 exhibits a timing signal 212 including the timing transition 214. Alternatively, the digital timing select signal 108 may instead be set to yield an analog timing select signal at the level 206. In this case, when the comparator 106 detects the ramp signal 202 reaching the level 206, the output 112 of the comparator 106 exhibits the timing signal 216 with the timing transition 218.

Figure 1:
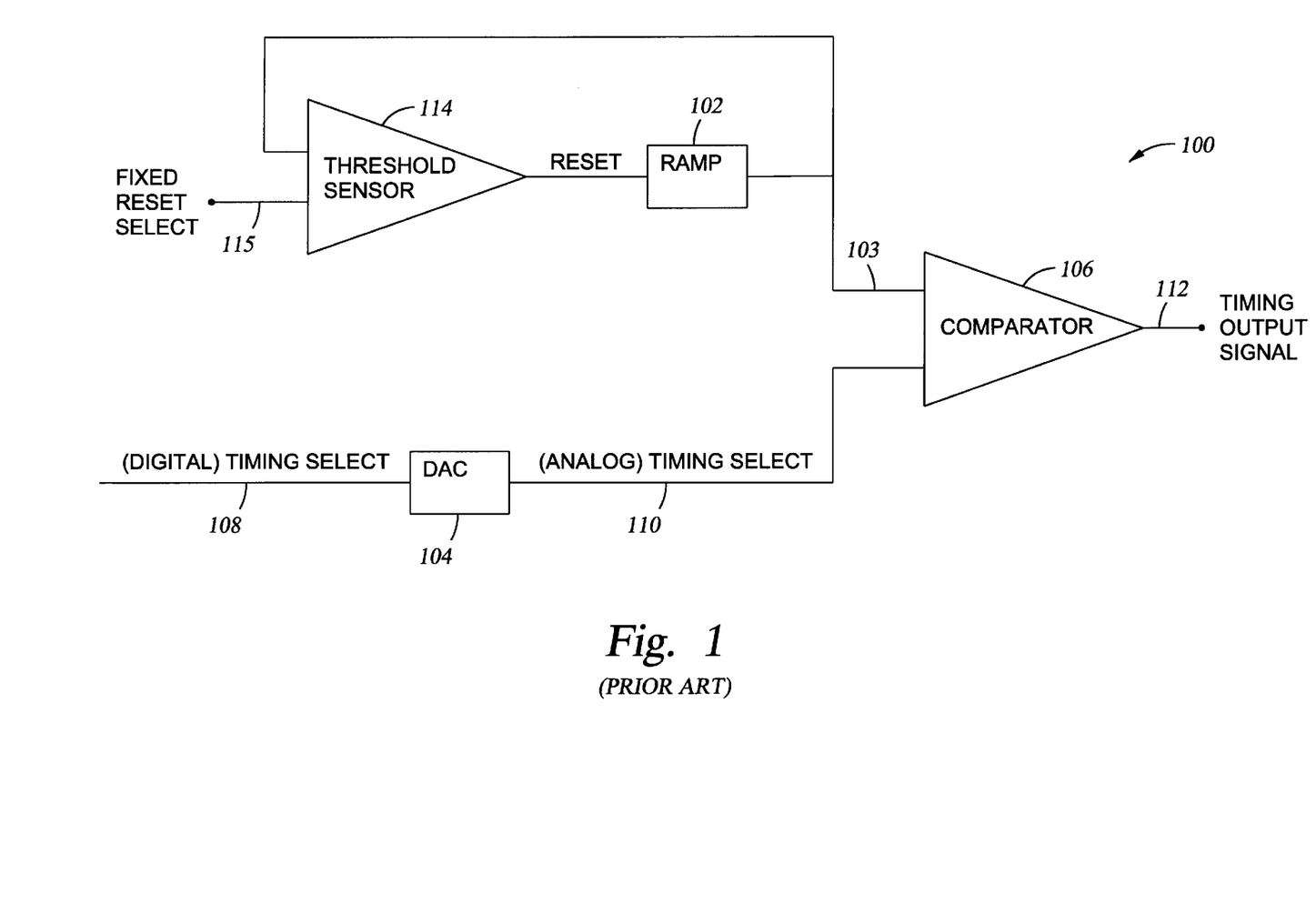
FIG. 1 is a block diagram of the hardware components and interconnections of a known timing vernier.

As shown in FIG. 1, the threshold sensor 114 is provided to recognize when the output signal 103 of the ramp 102 reaches a fixed threshold value 220, set by the input 115. When the output signal 103 reaches the value 220, the threshold sensor 114 resets the ramp 102, causing the ramp 102 to increase its output back to the predetermined starting value 222 (FIG. 2). There may be some delay in reaching the steady-state value 222 due to overshooting and/or ringing that occurs in a region 224 of the waveform 200.

Although known timing verniers such as the foregoing constitute significant advances and enjoy widespread commercial success today, AMCC has continually sought to improve the performance and efficiency of their timing verniers. One area of particular focus is the speed and signal resolution of timing signals. All timing verniers produce timing signals whose frequency is subject to some maximum value, beyond which the resultant timing signal may unreliable. If the timing signal is not sufficiently fast or crisp in definition, the circuit using the timing signal may produce inaccurate data.

Nonetheless, with the ever-increasing operating speeds of circuits to be tested, it is increasingly important to have timers that provide faster and more clearly defined timing signals. Consequently, advances are continually needed to boost the speed and resolution of timing signals.

SUMMARY OF THE INVENTION

Broadly, the present invention concerns a ramp circuit that repeatedly generates a substantially linear ramp signal. Although the ramp circuit includes a certain capacitance that otherwise causes nonlinearity in the ramp output signal, the introduction of charge balancing improves ramp signal linearity, thus enabling faster retriggering. Unlike prior ramps, the present circuit is therefore capable of significantly faster repetition rates. Thus, this invention is especially useful for testing high speed components such as RAM, microprocessors, high speed logic, and the like.

The ramp circuit of this invention includes various circuit elements including an output transistor, with its output coupled to a current source and an output capacitor. The output capacitor charges when the transistor is on. When the transistor is turned off, the output capacitor discharges, resulting in the linear ramp signal. In addition to the output transistor, the ramp includes first and second input transistors, each having a power supply node, input node, and output node. The first input transistor receives a "reset" signal at its input node. The second transistor receives the inverse of the reset signal, a "trigger" signal, at its input node. Both input transistors' output nodes are coupled to a current source. The second transistor's power supply node is coupled to the output transistor's input node, and also coupled to a resistance device attached to the power supply.

The output transistor inherently includes a junction capacitance, which causes a nonlinearity in the discharge of the charge storage device. This nonlinearity appears as a quick drop in the ramp signal relative to the slower rate of steady-state decrease. This nonlinearity is prevented, however, by compensating for the output transistor's junction capacitance. In one embodiment, the compensation circuitry includes a compensation capacitor and resistance device coupled in series between the transistor's output and a power supply. The junction between this resistance device and compensation capacitor is coupled to the first input transistor's power supply node.

The invention affords its users with a number of distinct advantages. Chiefly, the invention enables extremely high speed clocking of fast circuit components. Since the ramp output signal does not initially experience an unusable nonlinear drop, the entire ramp signal is usable for timing. Consequently, the ramp signal may be shortened, due to the absence of the unusable signal. Moreover, the ramp may be reset more quickly, permitting extremely fast repetition rates. The invention also provides a number of other advantages and benefits, which should be apparent from the following description of the invention.

DETAILED DESCRIPTION

The nature, objects, and advantages of the invention will become more apparent to those skilled in the art after considering the following detailed description in connection with the accompanying drawings. As mentioned above, the invention concerns a ramp circuit that uses capacitive compensation to improve signal linearity, enabling faster retriggering.

Analysis of Ramp Characteristics

Figure 3:
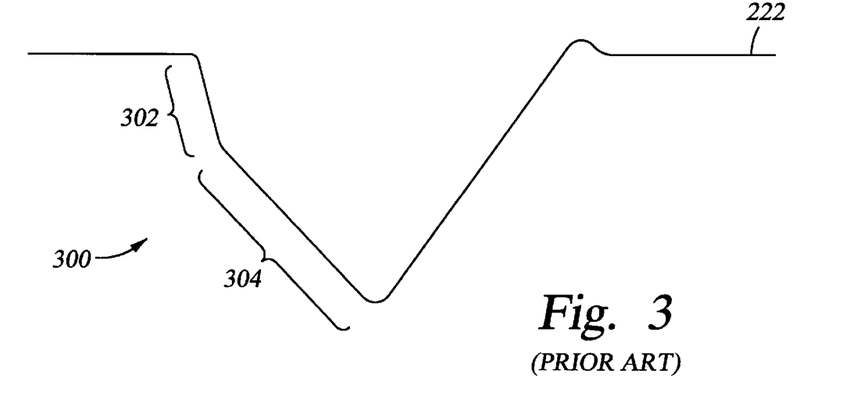
FIG. 3 is a timing diagram illustrating a known ramp signal.

The present inventor has discovered that one potential problem area with timing verniers such as the unit 100 is the ramp 102. In particular, ramp signals produced by the ramp 102 include certain imperfections that prevent sufficiently rapid retriggering to satisfy certain high speed applications. FIG. 3 shows a detailed look at an exemplary ramp output signal 300. The signal 300 provides a generally linear voltage drop in a range 304. However, due to certain electrical characteristics of the ramp 102, a relatively brief nonlinear region 302 appears in the output signal 300. Namely, the region 302 exhibits an accelerated drop in the ramp signal compared to the following period 304 of relatively slower, steady-state decrease. Although the region 302 itself might be linear, it is nonlinear with respect to the majority of the signal 300 including the region 304.

Consequently, the useful range of the ramp 102 does not begin until the linear range 304 commences. As discovered by the present inventor, this initial wasted time (during region 302) lengthens the entire cycle of the ramp signal 300, preventing an otherwise faster retrigger rate.

Figure 4:
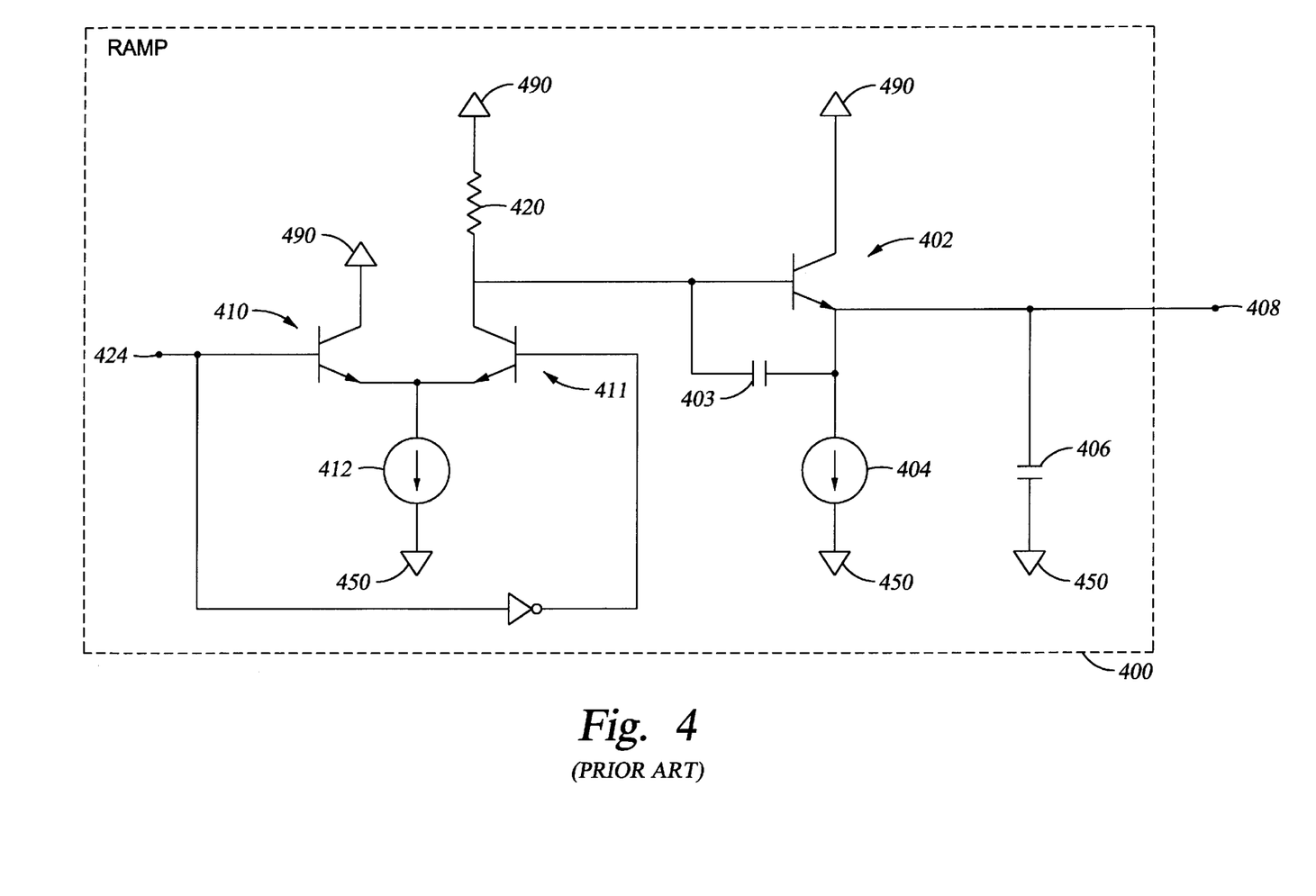
FIG. 4 is a schematic diagram showing the hardware components and interconnections of a known ramp circuit.

To improve upon conventional ramp design, the present inventor undertook a detailed study of such ramp circuits, an example of which is shown by the ramp circuit 400 of FIG. 4. As typically implemented, the ramp circuit 400 includes an output transistor 402 whose emitter provides the output 408 of the ramp 400. The output transistor 402 is typically a bipolar junction transistor. A current source 404 and a capacitor 406 are coupled between the output 408 and electrical ground 450. The transistor 402 receives power from a fixed voltage power supply 490.

The ramp 400 also includes input transistors 410–411, which are also bipolar junction transistors. The emitters of the transistors 410–411 are interconnected. A current source 412 is coupled between the interconnected emitters and electrical ground 450. The collector of the transistor 410 receives power from the fixed power supply 490. The collector of the transistor 411 is coupled to the base of the transistor 402, and also to the power supply 490 via a pull-up resistor 420. The base of the input transistor 411 receives the inverse of the signal provided to the other input transistor's base at 424.

As discovered by the present inventor, a hidden component of the ramp 400 is a capacitance 403 between the transistor 402's emitter and base. The capacitance 403 is not a discrete component of the ramp 400; rather, it is inherent in the base-emitter junction of the transistor 402, resulting in charge injection at the node 408 that causes the nonlinear signal excursion 302 (FIG. 3).

Figure 5:
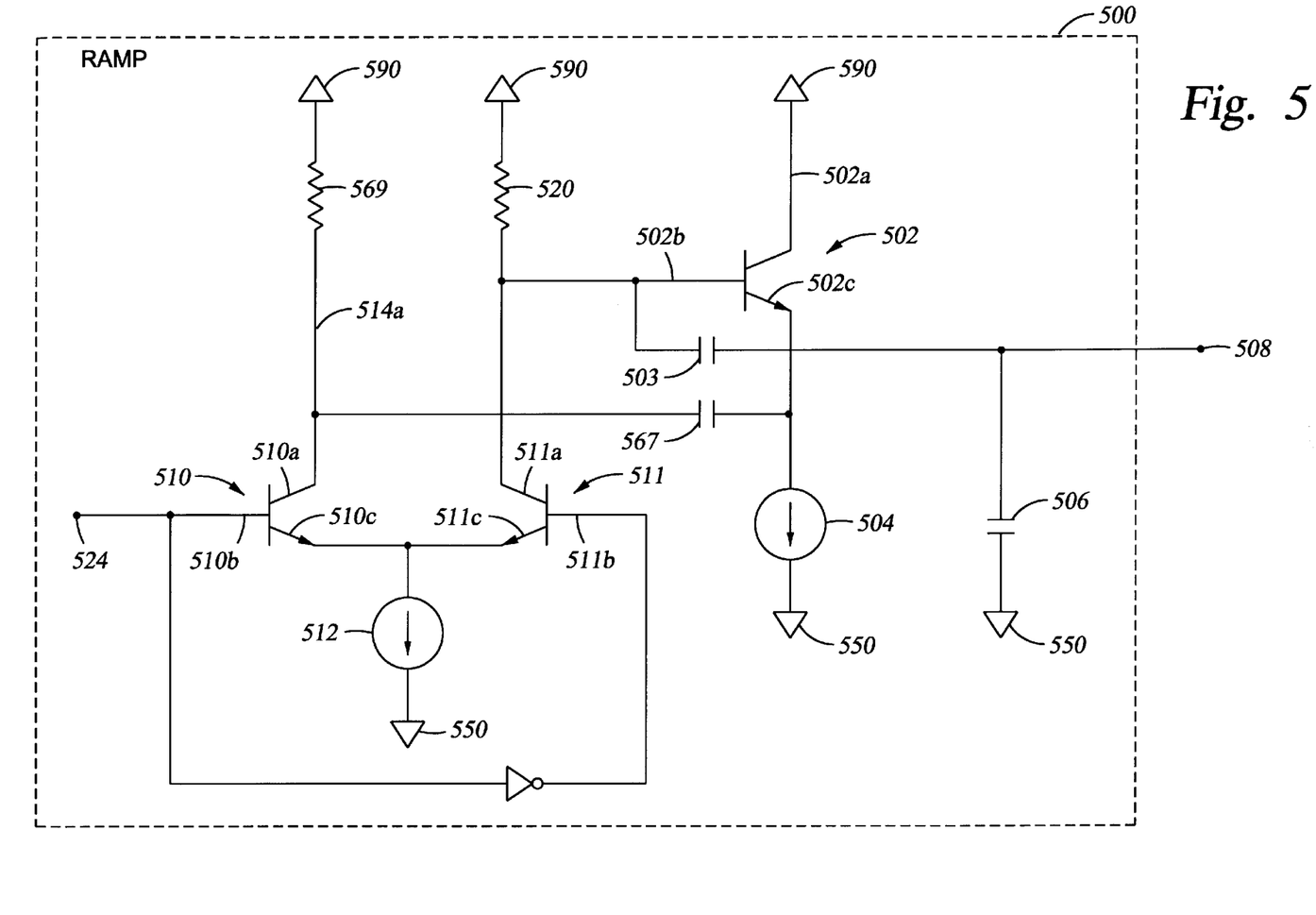
FIG. 5 is a schematic diagram showing the hardware components and interconnections of one ramp circuit according to the present invention.
Figure 6:
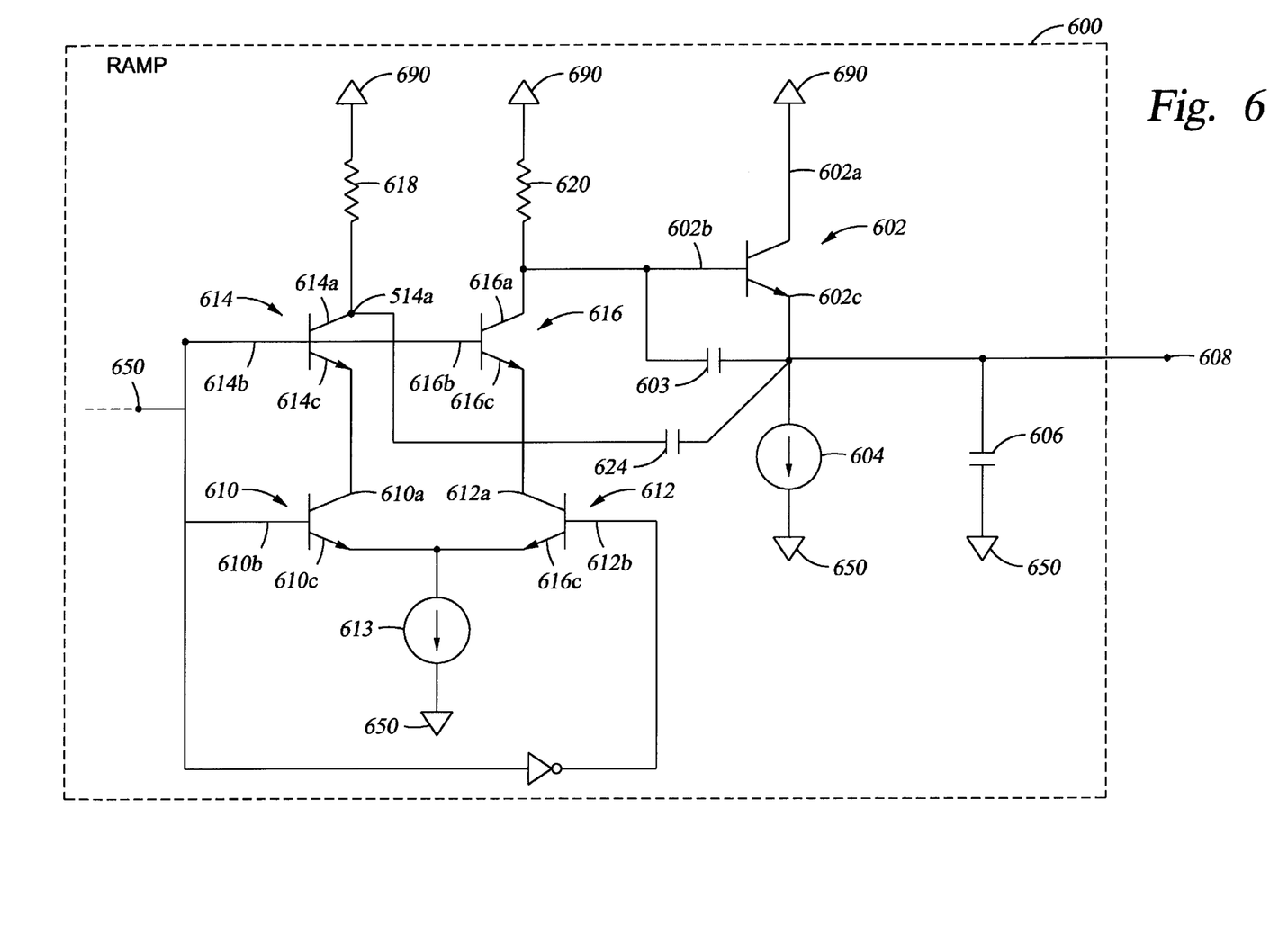
FIG. 6 is a schematic diagram showing the hardware components and interconnections of a modified ramp circuit, with improved input.

The present inventor has recognized that the nonlinear region 302 can be avoided by compensating for the junction capacitance 403. Thus, one aspect of this invention is a ramp that includes circuitry compensating for junction capacitance 403 in the output transistor 402. FIGS. 5–6 show the hardware components and interconnections of two different embodiments of charge balancing ramp 500 according to the invention, which are discussed as follows.

New Ramp Design: Hardware Components & Interconnections

First Embodiment

FIG. 5 shows a ramp 500 that illustrates one embodiment of ramp circuit according to the invention. FIG. 6 (discussed below) depicts a modified ramp 600, including a number of circuit components added to the ramp 500.

Referring to FIG. 5, the ramp 500 includes an output transistor 502 having a power supply node 502a, input node 502b, and output node 502c. The transistor 502 comprises a circuit element providing output signals at the output node 502c responsive to the signal at the input node 502b.

The power supply node 502a is coupled to a power supply 590 having a predetermined source voltage. The voltage at the output node 502c constitutes a ramp output signal, present at ramp output 508. Between the node 508 and electrical ground 550, a current source 504 and output capacitor 506 are interposed in parallel.

Junction capacitance of the transistor 502 is illustrated by the capacitor 503, which is not a discrete component of the ramp 500 but an inherent characteristic of the transistor 502. The junction capacitor 503 spans the transistor's input node 502b and output node 502c. The transistor 502, current source 504, and ramp capacitor 506 may be collectively referred to as an "output stage".

In the illustrated embodiment, the ramp 500 also includes two input transistors 510–511, a second current source 512, pull-up resistors 520/569, and a compensation capacitor 567. Each transistor 510–511 has respective power supply nodes 510a–511a, input nodes 510b–511b, and output node 510c–511c. In the illustrated example, the transistors 510 and 511 have substantially similar device characteristics. Similarity of device characteristics includes, for example, similar operating ranges, similar output signals under like conditions of reference voltage and input signal, etc.

The transistors 510–511 are interconnected at their output nodes 510c–511c, which are also coupled to electrical ground 550 via the current source 512. The transistors 510–511 comprise a differential pair. Regarding the transistor 510, its input node 510b is coupled to a reset input 524 to the ramp 500, and its power supply node 510a is coupled to the pull-up resistor 569, which is connected to the power supply 590. Regarding the transistor 511, its input node 511b receives a signal complementary to the reset input 524, and its power supply node 511a is coupled to the pull-up resistor 520 in turn connected to the power supply 590.

The compensation capacitor 567 is interposed between the node 508 and the power supply node 510a of the first transistor 510. Although a capacitor is shown, another selectively dischargeable charge storage device may be used, such as an active device junction. As explained in greater detail below, the capacitor 567 helps compensate for the junction capacitance 503, thereby reducing the nonlinear signal excursion 302 (FIG. 3). To assist in this endeavor, the capacitor 567 may have substantially equal capacitance as the junction capacitance 503. Likewise, the resistors 520 and 569 may also exhibit substantially the same electrical resistance.

The ramp 500 may be implemented in various different embodiments, each using a different variety of subcomponents. For example, even though resistors are shown to illustrate the devices 569 and 520, other components may be used instead, such as diodes, zener diodes, transistor junctions, or any other suitable voltage dissipating circuit component. Furthermore, the transistors 502 and 510–511 may be implemented using bipolar junction transistors, field effect transistors, diode arrangements, a combination of the foregoing, or any suitable switching component(s) providing an output signal proportional to a corresponding input.

According to the invention, the ramp 500 may be manufactured in various ways. For instance, the ramp 500 may be implemented using discrete circuit components, a new or commercially available integrated circuit, an application specific integrated circuit, or a "macro" supplied for incorporation into an ASIC.

Also, without departing from the invention, the individual components of the ramp 500 may be changed in various ways. For instance, although the current sources 504/522 are shown providing electrical current flowing toward electrical ground 550, the ramp 500 may be alternatively designed, with appropriate reference voltages and input signals, so that the current sources provide current in the opposite direction. Ordinarily skilled artisans, having the benefit of this disclosure, will also recognize many other possible modifications to the disclosed circuitry without departing from the invention.

Second Embodiment

FIG. 6 shows a ramp 600 that illustrates a modified ramp circuit according to the invention. The ramp 600 includes a number of circuit components added to the ramp 500.

The ramp 600 includes an output transistor 602, having a power supply node 602a, input node 602b, and output node 602c. The transistor 602 comprises a circuit element providing output signals on at the output node 602c responsive to the signal at the input node 602a.

The power supply node 602a is coupled to a predetermined power supply 690 having a predetermined source voltage. The voltage at the output node 602c constitutes a ramp output signal, present at ramp output 608. Between the node 608 and electrical ground 650, a current source 604 and output capacitor 606 are interposed in parallel.

Junction capacitance of the transistor 602 is illustrated by the capacitor 603, which is not a discrete component of the ramp 600 but an inherent characteristic of the transistor 602. The junction capacitor 603 spans the transistor's input node 602b and output node 602c. The transistor 602, current source 604, and ramp capacitor 606 may be collectively referred to as an "output stage".

In the illustrated embodiment, the ramp 600 includes four additional transistors 610–616, a second current source 622, two pull-up resistors 618/620, and a compensation capacitor 624. Each transistor 610–616 has respective power supply nodes 610a–616a, input nodes 610b–616b, and output nodes 610c–616c.

The first and second transistors 610/612 are interconnected at their output nodes 610c–612c, which are also coupled to electrical ground 650 via the current source 613. The transistors 610/612 comprise a differential pair. In this respect, the transistors 610/612 are selected to exhibit substantially identical device characteristics. Similarity of device characteristics includes, for example, similar operating ranges, similar output signals under like conditions of reference voltage and input signal, etc. The transistors 610/612 may, but need not, have similar device characteristics as the transistors 614/616.

The power supply nodes 610a–612a of the transistors 610/612 are coupled to the output nodes 614c/616c of the transistors 614/616. The input node 610b of the transistor 610 is coupled to a reset input 650 of the ramp 600; the input node 612b of the transistor 612 receives a signal complementary of the reset input 650.

The transistors 614/616 comprise cascode devices that serve to isolate the output node 608 from any possible switching noise from the transistors 610/612. Power supply nodes 614a/616a of the transistors 614/616 are coupled to the power supply 690 via the pull-up resistors 618/620, respectively. The power supply node 616a of the transistor 616 is further coupled to the input node 602b of the output transistor 602. The power supply node 614a of the transistor 614 is coupled to the compensation capacitor 624. In the illustrated example, each transistor 614/616 exhibits substantially similar device characteristics as the other.

Although a capacitor is shown, the compensation capacitor 624 may alternatively be provided by any selectively dischargeable charge storage device, such as an active device junction. As explained in greater detail below, the capacitor 624 helps compensate for the junction capacitance 603, thereby reducing the nonlinear signal excursion 302 (FIG. 3). To aid in this purpose, the capacitor 624 may have substantially equal capacitance as the junction capacitance 603. Likewise, the resistors 618 and 620 may also exhibit substantially equal electrical resistance.

The ramp 600 may be implemented in various different embodiments, each using a different variety of subcomponents. For example, even though resistors are shown to illustrate the devices 618/620, other components may be used instead, such as diodes, zener diodes, transistor junctions, or any other suitable voltage dissipating circuit component. Furthermore, the transistors 602 and 610–614 may be implemented using bipolar junction transistors, field effect transistors, diode arrangements, a combination of the foregoing, or any suitable switching component(s) providing an output signal proportional to a corresponding input.

According to the invention, the ramp 600 may be manufactured in various ways. For instance, the ramp 600 may be implemented using discrete circuit components, a new or commercially available integrated circuit, an application specific integrated circuit, or a "macro" supplied for incorporation into an ASIC.

Also, without departing from the invention, the individual components of the ramp 600 may be changed in various ways. For instance, although the current sources 604/613 are shown providing electrical current flowing toward electrical ground 650, the ramp 600 may be alternatively designed, with appropriate reference voltages and input signals, so that the current sources provide current in the opposite direction. Ordinarily skilled artisans, having the benefit of this disclosure, will also recognize many other possible modifications to the disclosed circuitry without departing from the invention.

New Ramp Design: Operation

In addition to the hardware embodiments described above, a different aspect of the invention concerns the operation of the invention's ramp. This procedure is illustrated with the aid of the timing diagram of FIG. 7, in the context of the ramp circuit 600 (FIG. 6).

Basically, the ramp 700 (FIG. 7) produces an analog signal at the output 608. The ramp's output signal is shown by the waveform 700. As one example, the ramp output signal may be an electrical voltage, current, or another electrical property.

Figure 7:
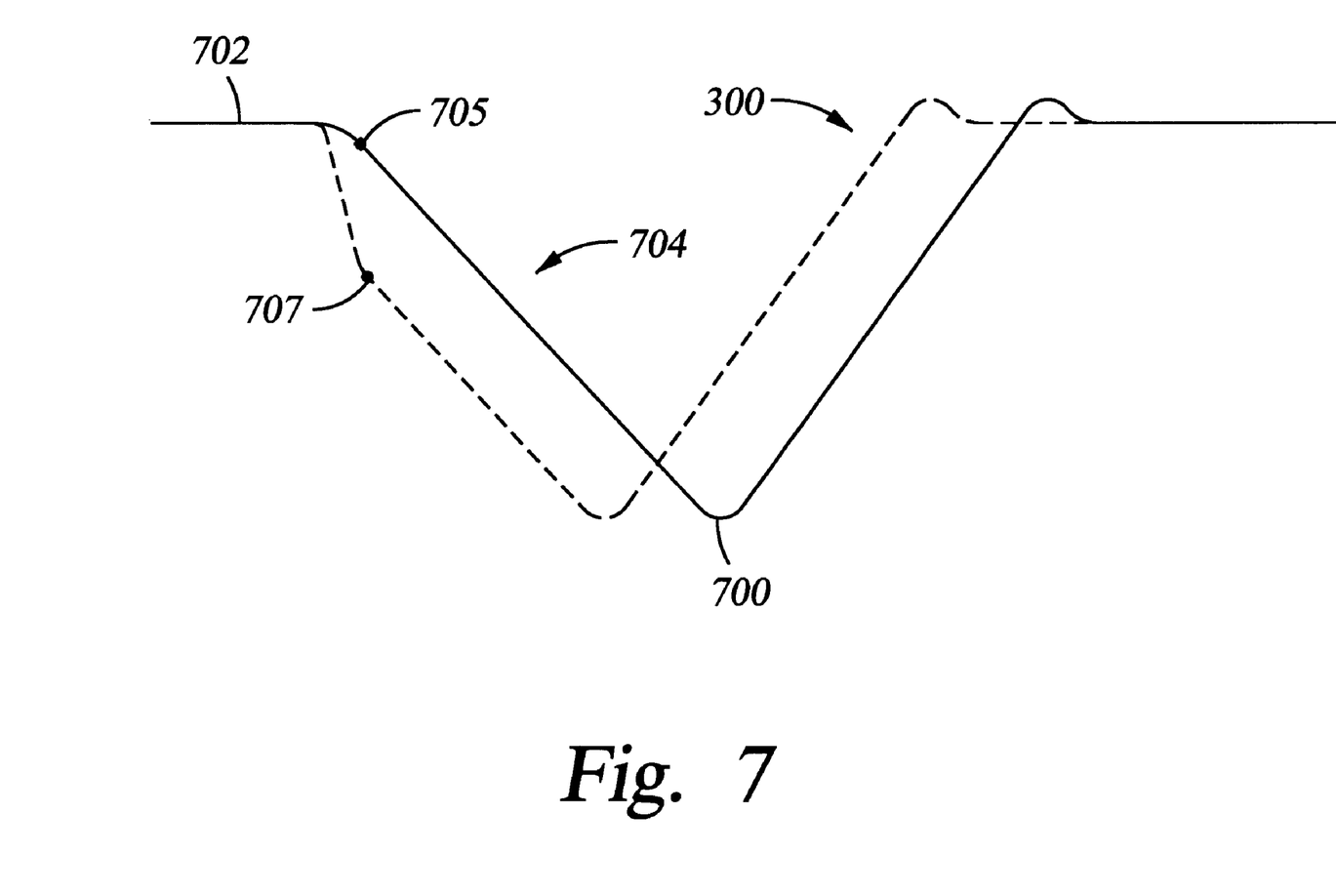
FIG. 7 is a timing diagram illustrating the operation of present invention's ramp.

The ramp signal 700 signal starts at a predetermined level 702. From this level 702, the ramp signal 700 decreases substantially linearly at a prescribed linear rate. The commencement of the decreasing ramp output signal occurs in response to the ramp 700 receiving a "trigger" signal at the input 650. In the present example, the trigger signal comprises a binary zero, which activates the transistor 612.

Advantageously, the ramp output signal 700 exhibits a substantially linear decreasing signal 704, unlike the nonlinear signal 300 shown side-by-side in FIG. 7 for comparison. As an example, the decreasing ramp signal may exhibit a linear decrease of about one volt/nanosecond. This improved linearity results from charge balancing provided by the compensation capacitor 624, as explained in greater detail below.

Particularly, operation of the illustrated embodiment of ramp 600 is described as follows. The initial signal level 702 is provided by the output capacitor 606, which is charged by reset current provided by the output transistor 602. The transistor 602 is reversed biased by a voltage swing at the power supply node 616a of the transistor 616 during the ramp signal's linear excursion. The fast edge rate at the power supply node of the transistor 616 injects charge via the junction capacitance 603 of the transistor 602 onto the ramp capacitor 606. This charge flows off the ramp capacitor 606, thus adding to the ramp current and preventing nonlinearity in the ramp signal. More particularly, the presence of the compensation capacitor 624, charge is injected approximately equal to the charge removed by the junction capacitance 624. The voltage swing at the power supply node of the transistor 614 is equal in magnitude to the voltage swing at the power supply node of the transistor 616. First order charge balancing is achieved, and the resulting nonlinearity in the ramp output signal is greatly reduced.

The linear region of the signal 700, usable for precision timing, occurs after the charge injection transient via the junction capacitance 603 goes to zero. Accordingly, the first usable sampling point in the inventive ramp signal 700 occurs at 705, significantly earlier than the first usable point 707 in the ramp signal 300 of prior ramps.

After completion of the ramp's linear descent, the ramp circuit 600 may be reset by applying a reset signal to the input 650. In the illustrated example, the reset signal comprises a binary one, which activates the transistor 610. The reset and trigger signals are always opposite in this example. Application of the reset signal resets the ramp signal 700 to the starting level 702.

Other Embodiments

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

What is claimed is:

1. A ramp signal apparatus, comprising:

an output transistor, having a power supply node, an input node, and an output node, the power supply node coupled to a predetermined source voltage;

an output charge storage device coupled between the output transistor's output node and electrical ground;

an output current source coupled between the output transistor's output node and electrical ground;

first and second transistors, each having a power supply node, an input node, and an output node, the output nodes of the first and second transistors being electrically connected, the input nodes of the first transistor being coupled to a reset input line, the input node of the second transistor being coupled to a trigger line providing an inverse of the reset input line;

a compensation charge storage device coupled between the output transistor's output node and the first transistor's power supply node;

a first resistance device coupled between the first transistor's power supply node and a predetermined source voltage;

a second resistance device coupled between the second transistor's power supply node and a predetermined source voltage; and a current source coupled between electrical ground and the first and second transistors' connected output nodes.

2. The apparatus of claim 1, at least one of the transistors comprising a bipolar junction transistor where the input node, the power supply node, and the output node are respectively provided by a base, a collector, and an emitter of the bipolar junction transistor.

3. The apparatus of claim 1, at least one of the transistors comprising a field effect transistor where the input node, the power supply node, and the output node are respectively provided by a gate, a source, and a drain of the field effect transistor.

4. The apparatus of claim 1, at least one of the resistance devices comprising a resistor.

5. The apparatus of claim 1, the predetermined source voltages being a positive voltage, the first and second current sources flowing current in a direction toward the electrical ground.

6. The apparatus of claim 1, the charge storage devices comprising capacitors.

7. The apparatus of claim 1, the output transistor exhibiting a junction capacitance between its output and input nodes, the compensation charge storage device having a capacitance substantially equal to the junction capacitance.

8. The apparatus of claim 1, the first and second transistors having substantially equal device characteristics.

9. The apparatus of claim 1, the first and second resistance devices having substantially equal resistance.

10. A ramp generator, comprising:
an output stage, comprising:
an output transistor, having a power supply node, an input node, and an output node, the power supply node coupled to a predetermined source voltage;
an output charge storage device coupled between the output transistor's output node and electrical ground;
an output current source coupled between the output transistor's output node and electrical ground;
the output stage initiating a ramp output signal decreasing from a predetermined starting level at a predetermined rate responsive to receipt of an input signal at the output transistor's input node, the output stage having a capacitance causing the ramp output signal to exhibit a period of accelerated signal decrease in relation to the predetermined rate substantially immediately upon receiving the input signal; and
a compensation module, coupled to the output stage to prevent the accelerated signal decrease by compensating for the output stage capacitance.

11. The generator of claim 10, the compensation module comprising:
first and second transistors, each having a power supply node, an input node, and an output node, the output nodes of the first and second transistors being electrically connected, the input nodes of the first transistor being coupled to a reset input line, the input node of the second transistor being coupled to a trigger line providing an inverse of the reset input line;
a compensation charge storage device coupled between the output transistor's output node and the first transistor's power supply node;
a first resistance device coupled between the first transistor's power supply node and a predetermined source voltage;
a second resistance device coupled between the second transistor's power supply node and a predetermined source voltage; and
a current source coupled between electrical ground and the first and second transistor's interconnected output nodes.

12. The generator of claim 11, at least one of the transistors comprising a bipolar junction transistor where the input node, the power supply node, and the output node are respectively provided by a base, a collector, and an emitter of the bipolar junction transistor.

13. The generator of claim 11, at least one of the transistors comprising a field effect transistor where the input node, the power supply node, and the output node are respectively provided by a gate, a source, and a drain of the field effect transistor.

14. The generator of claim 11, at least one of the resistance devices comprising a resistor.

15. The generator of claim 11, the predetermined source voltages being a positive voltage, the first and second current sources flowing current in a direction toward the electrical ground.

16. The generator of claim 11, the charge storage devices comprising capacitors.

17. The generator of claim 11, the output stage capacitance being exhibited by the output transistor, between its output and input nodes, the first charge storage device having a capacitance substantially equal to the output stage capacitance.

18. The generator of claim 11, the first and second transistors having substantially equal device characteristics.

19. The generator of claim 10, the compensation module comprising:
first, second, third, and fourth transistors, each having a power supply node, an input node, and an output node, the output nodes of the first and second transistors being electrically connected, the input nodes of the first and third transistors being interconnected, the power supply node of the fourth transistor being coupled to the output transistor's input node, the power supply nodes of the first and second transistors being connected to the output nodes of the third and fourth transistors, respectively, the input nodes of the first and second transistors receiving complementary input signals;
a compensation charge storage device coupled between the output transistor's output node and the third transistor's power supply node;
a first resistance device coupled between the third transistor's power supply node and a predetermined source voltage;
a second resistance device coupled between the fourth transistor's power supply node and a predetermined source voltage; and
a current source coupled between electrical ground and the first and second transistors' interconnected output nodes.

20. The generator of claim 19, at least one of the transistors comprising a bipolar junction transistor where the input node, the power supply node, and the output node are respectively provided by a base, a collector, and an emitter of the bipolar junction transistor.

21. The generator of claim 19, at least one of the transistors comprising a field effect transistor where the input node, the power supply node, and the output node are respectively provided by a gate, a source, and a drain of the field effect transistor.

22. The generator of claim 19, at least one of the resistance devices comprising a resistor.

23. The generator of claim 19, the predetermined source voltages being a positive voltage, the first and second current sources flowing current in a direction toward the electrical ground.

24. The generator of claim 19, the charge storage devices comprising capacitors.

25. The generator of claim 19, the output stage capacitance being exhibited by the output transistor, between its output and input nodes, the first charge storage device having a capacitance substantially equal to the output stage capacitance.

26. The generator of claim 19, the first and second transistors having substantially equal device characteristics.

27. The generator of claim 19, the second and third transistors having substantially equal device characteristics.

28. A ramp generator having an output stage, comprising:
first means for initiating a ramp output signal at the output stage decreasing from a predetermined starting level at a predetermined rate responsive to receipt of an input signal, the output stage having a capacitance causing the ramp output signal to exhibit a period of accelerated signal decrease in relation to the predetermined rate substantially immediately upon receiving the input signal; and second means coupled to the output stage for preventing the accelerated signal decrease by compensating for the capacitance.

* * * * *